United States Patent
Carpi et al.

(10) Patent No.: US 6,784,070 B2
(45) Date of Patent: Aug. 31, 2004

(54) INTRA-CELL MASK ALIGNMENT FOR IMPROVED OVERLAY

(75) Inventors: Enio L. Carpi, Fishkill, NY (US); Bernhard Liegl, Cold Spring, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/309,291

(22) Filed: Dec. 3, 2002

(65) Prior Publication Data

US 2004/0105961 A1 Jun. 3, 2004

(51) Int. Cl.⁷ .............................................. H01L 21/76
(52) U.S. Cl. ....................... 438/401; 438/381; 438/945
(58) Field of Search ................................. 438/401, 238, 438/381, 942–947

(56) References Cited

U.S. PATENT DOCUMENTS 5,550,074 A * 8/1996 Lin ............................. 438/291

OTHER PUBLICATIONS

Liebman, Lars et al., *High Resolution Ultraviolet Defect Inspection of DAP Reticles*, Proc. of SPIE 3873, 19th Annual BACUS Symposium on Photomask Technology, (Dec. 1999), pp. 148–160.

* cited by examiner

Primary Examiner—H. Jey Tsai

(57) ABSTRACT

A method for intra-cell alignment of a substrate and mask comprises providing a substrate comprising an exposed photosensitive material, providing a phase-shift mask, and aligning the phase-shift mask to an intra-cell structure on the substrate.

17 Claims, 7 Drawing Sheets

INTRA-CELL MASK ALIGNMENT FOR IMPROVED OVERLAY

BACKGROUND OF THE INVENTION

1. Field of the Invention

The present invention relates to a method and apparatus for aligning masks with semiconductor wafers.

2. Discussion of Related Art

Referring to FIG. 1, photolithography typically involves a substrate 101 covered with a photosensitive material or a resist that can be patterned. Patterns to be formed on the substrate 101 can be etched on a mask 102. The mask 102 can be used to transfer a pattern to the imageable photoresist layer of the substrate 101. Reduction optics 103 can be used to focus radiation from a light source 104 onto an area of the substrate 101.

Alignment of the mask 102 to the substrate 101 is important to manufacturing functional devices, and in particular to forming devices having small design rules, e.g., small critical dimensions. Alignment is the process of positioning the mask 102 over a predetermined position on the substrate 101, wherein the position can be determined relative to alignment marks. Alignment marks help ensure that the mask 102 can be aligned precisely with respect to the wafer 101.

Traditional alignment methods, wherein the alignment marks are located on a periphery of the chip, show limited performance for small ground rules. This is because, for example, the alignment marks in the periphery can be far away from the structure being patterned, wherein small deviations of the mask from the substrate can be exaggerated as the distance from the alignment mark increases.

Therefore, a need exists for a high-contrast, small alignment mark that can be implemented as means for an intra-cell alignment.

SUMMARY OF THE INVENTION

According to an embodiment of the present invention, a method for intra-cell alignment of a substrate and a mask comprises providing the substrate comprising a photosensitive material and an alignment structure in an intra-cell region of the substrate, providing a mask comprising a phase-shift region, and aligning the phase-shift region to the alignment structure of the substrate.

The method further comprises determining a phase conflict region, and determining the alignment structure of the substrate.

The method further comprises exposing a field of the substrate to actinic light to pattern the photosensitive material.

The alignment structure comprises a dot, a line, and/or a rectangle.

According to an embodiment of the present invention, a wafer comprises a first alignment structure positioned in a periphery of the chip, a plurality of cells formed on a surface of the wafer, and at least one second alignment structure formed between the plurality of cells.

According to an embodiment of the present invention, a method for intra-cell alignment of a substrate and a mask comprises providing the substrate comprising a photosensitive material, a first alignment structure in a periphery region of the substrate and a second alignment structure in an intra-cell region of the substrate. The method comprises providing a mask comprising a phase-shift region, pre-aligning the phase-shift region to the first alignment structure of the substrate, and aligning the phase-shift region to the second alignment structure of the substrate.

Pre-aligning comprises determining a phase conflict region, and determining the first alignment structure of the substrate.

The method comprises exposing a field of the substrate to actinic light to pattern the photosensitive material.

The second alignment structure comprises a dot, a line, and/or a rectangle.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

Figure 1:
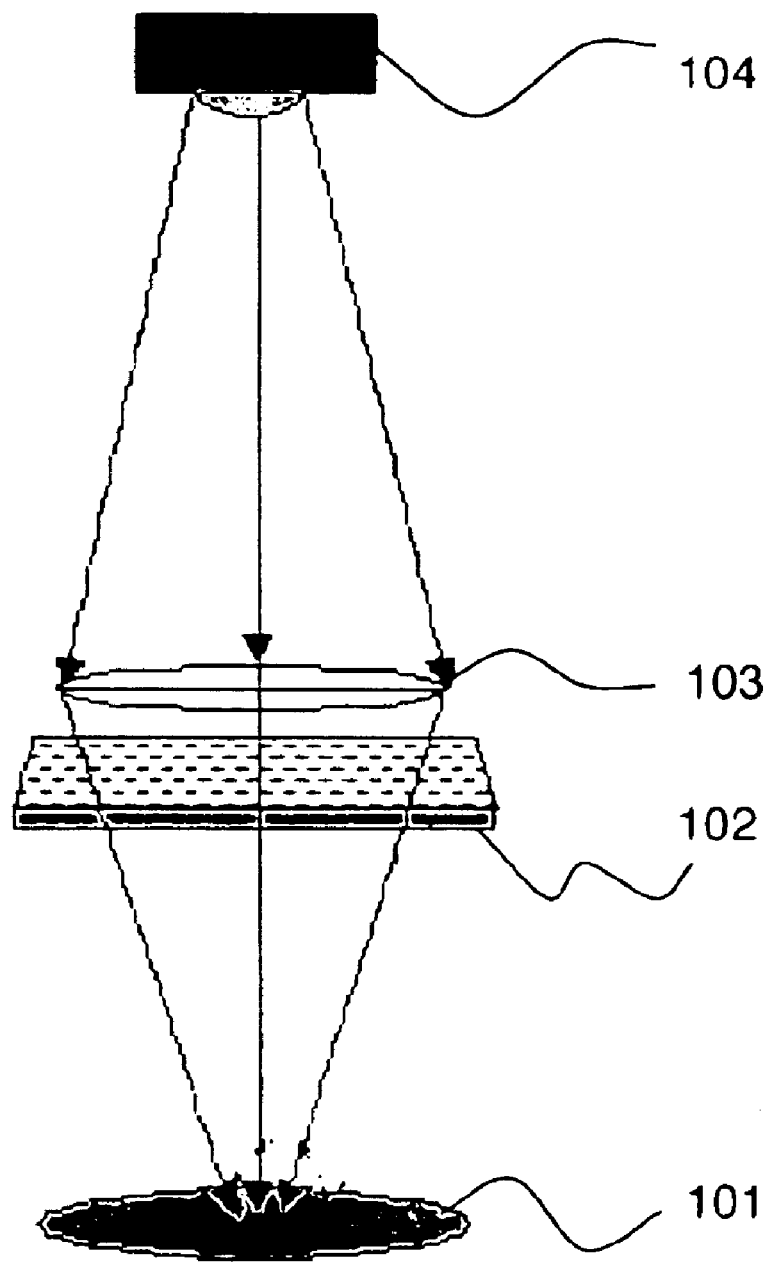
FIG. 1 is a diagram of a lithographic system.
Figure 2:
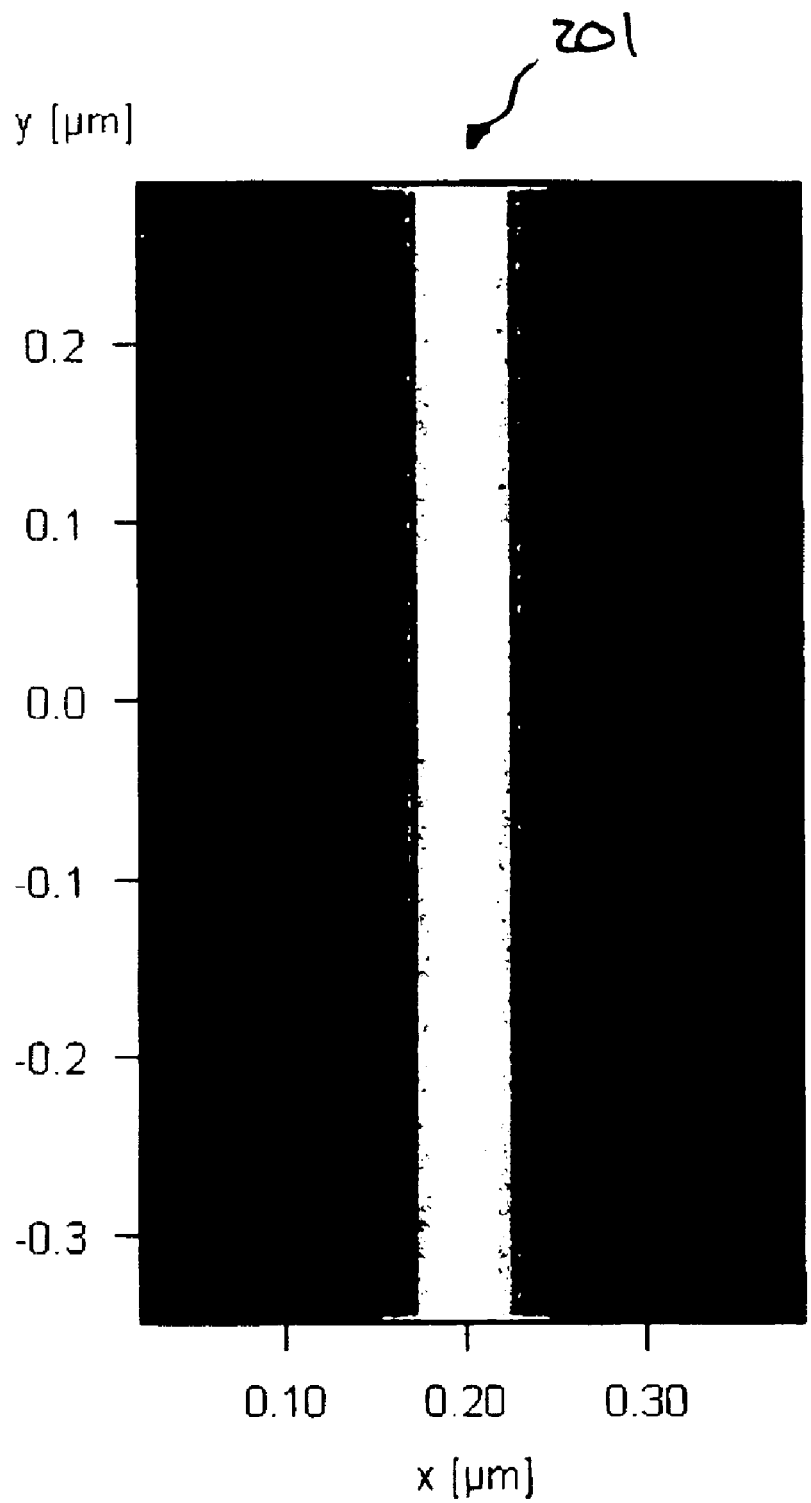
FIG. 2 is a diagram of the reflected light intensity of a phase-shift mark according to an embedment of the present invention.

According to an embodiment of the present invention, small Chromium-Less (Cr-Less) phase shift regions on a mask can create bright lines 201 in reflected mode, with sub-micron dimensions, as shown in FIG. 2. The contrast of lines depends on the phase difference between the regions of the mask. The maximum contrast can be obtained when the phase difference is 180 degrees.

Cr-Less masks are frequency doubling. For lines/spaces with 0.4 um at mask, lines/spaces of 0.2 um are observed at the wafer. Cr-Less masks can be advantageous at small ground rules due to higher contrast compared to Cr masks or Attenuated PSM (phase shift mask). Therefore, it can be easier to create alignment structures on an Cr-Less mask because the structures can be twice as larger as comparable Cr mask structures. In addition, the lines produced by the Cr-Less mask are more visible as groundrules shrink to sub-100 nm. Therefore, according to an embodiment of the present invention, phase shift regions can be aligned to other sub-micron structures on the wafer, which can allow for improved alignment of the mask to the substrate.

Figure 3:
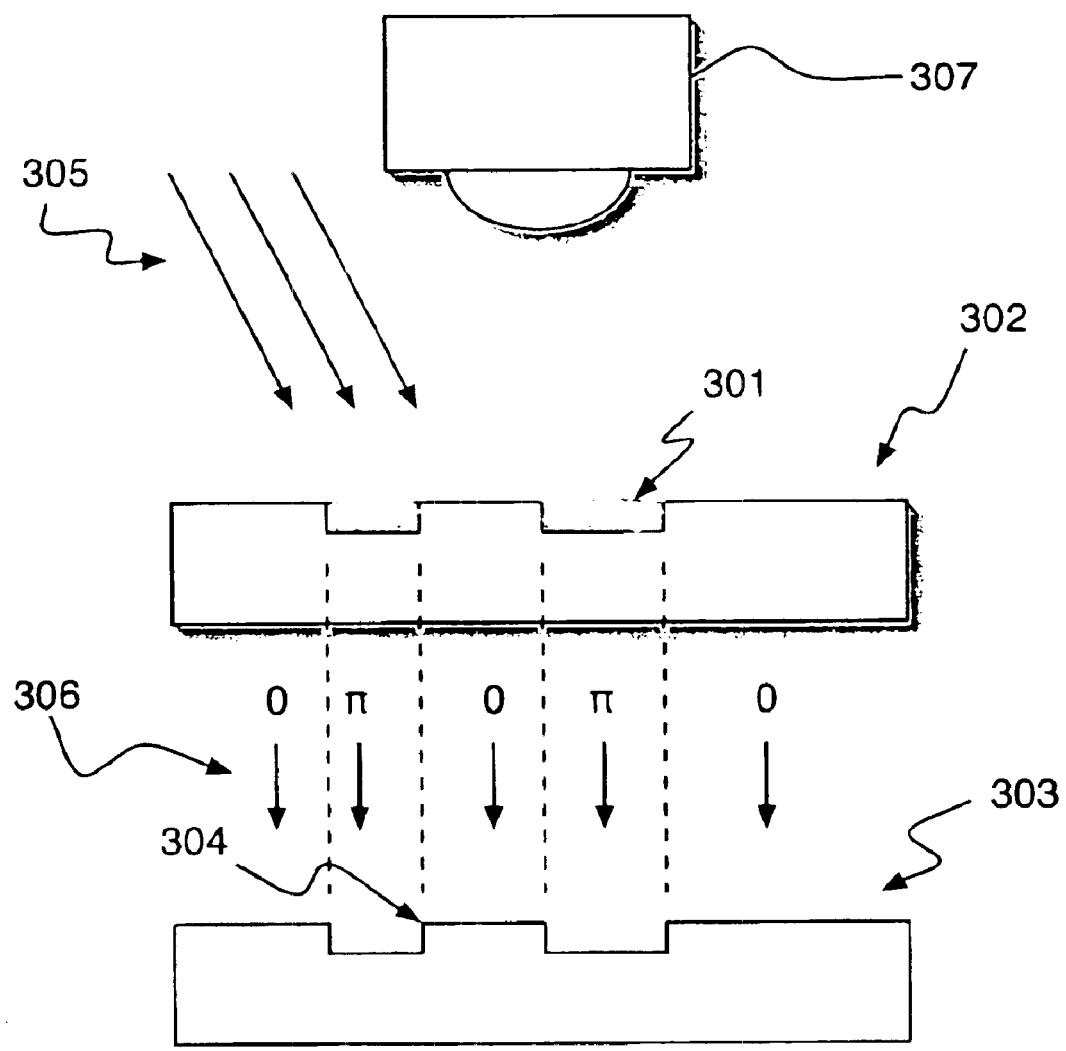
FIG. 3 is a diagram of a lithographic system according to an embedment of the present invention.

Phase-shift masks can enhance patterned contrast at the edges of small circuit features by destructive optical interference of light that passes through the mask with an adjacent band of light that propagates in air. Cr-less phase shift masks show high resolution being able to print narrow lines on a resist. The resolution of a Cr-Less mask is higher than a comparable Cr mask. Moreover, phase shift masks can be used for ground rules of 0.18 um and below because they can be used with comparably large process windows and offer improved resolution. The present invention can be applied to any ground rule, however, it is particularly advantageous for small ground rules when alignment is important and the tools of lithography are at their limits (e.g., in terms of feature size). An example of a phase shift alignment mask is shown in FIG. 3 as element 302. The alignment can be obtained using veneers, multiple lines, a dot or other adequate designs.

A phase shift mask can positively use light interference to improve the resolution of photolithography. In phase shift lithography, etching the mask substrate to a desired thickness can create phase sifting regions. For example, light waves passing through the thinner portions of the mask can be delayed, for example, by 180 degrees out of phase with the light waves passing through the thicker regions. At the edge of a phase-shifted region, the light waves passing through the thicker portions of the mask substrate and the light waves passing through the thinner portions cancel out producing a more sharply defined interface.

Figure 4:
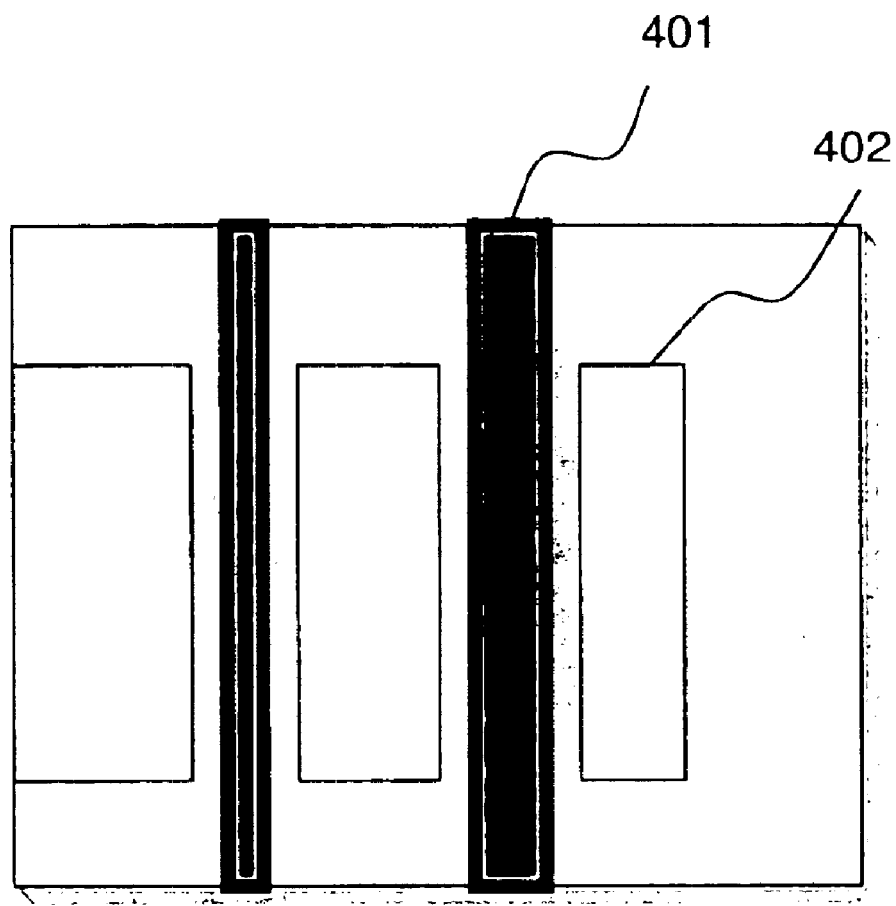
FIG. 4 is a diagram of a plurality of phase shift regions according to an embodiment of the present invention.

Referring to FIG. 3, the phase shift regions 301 of the mask 302 can be aligned to an intra-cell region of the substrate or wafer 303. The substrate 303 can comprises a variety of structures 304. For example, in a semiconductor memory device, a wordline can be a structure 304 used to align the mask 302 to the substrate 303. The mask 302 and substrate 303, including a resist (not shown), can be exposed to light 305 for purposes of alignment. Light 306 passing through phase shift regions 301 is denoted by π, indicating a 180 degree shift in the phase of the light relative to the light 306 passing through the mask, but not through a phase shift region 301, is denoted by 0. During exposure of the resist, an image of the alignment can be captured by a camera 307. The image can show the alignment of the phase-shift alignment marks to a structure 304 on the substrate 303. This allows for fine correction of mask alignment to the substrate. A view of the image captured by camera 307 is shown in FIG. 4.

Figure 5:
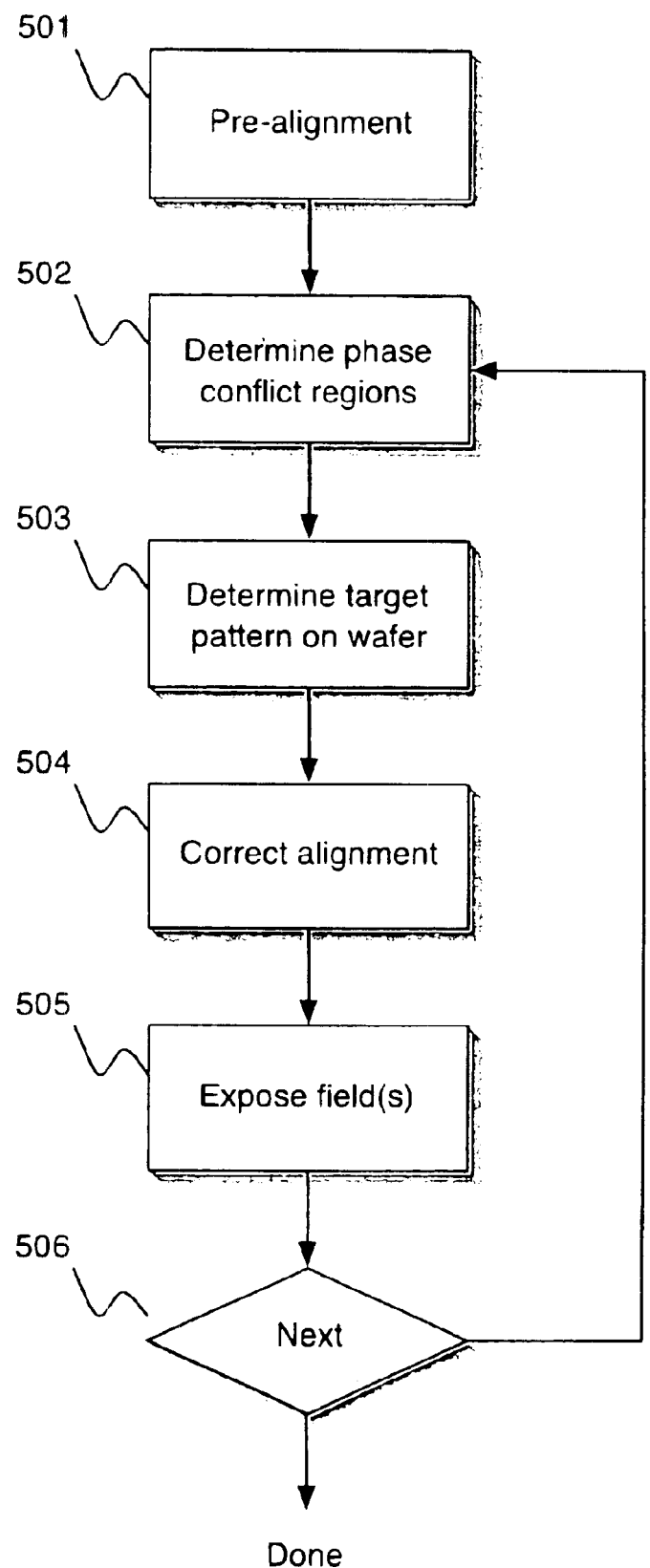
FIG. 5 is a flow chart of a method of aligning a phase conflict region to a target pattern according to an embodiment of the present invention.
Figure 6A:
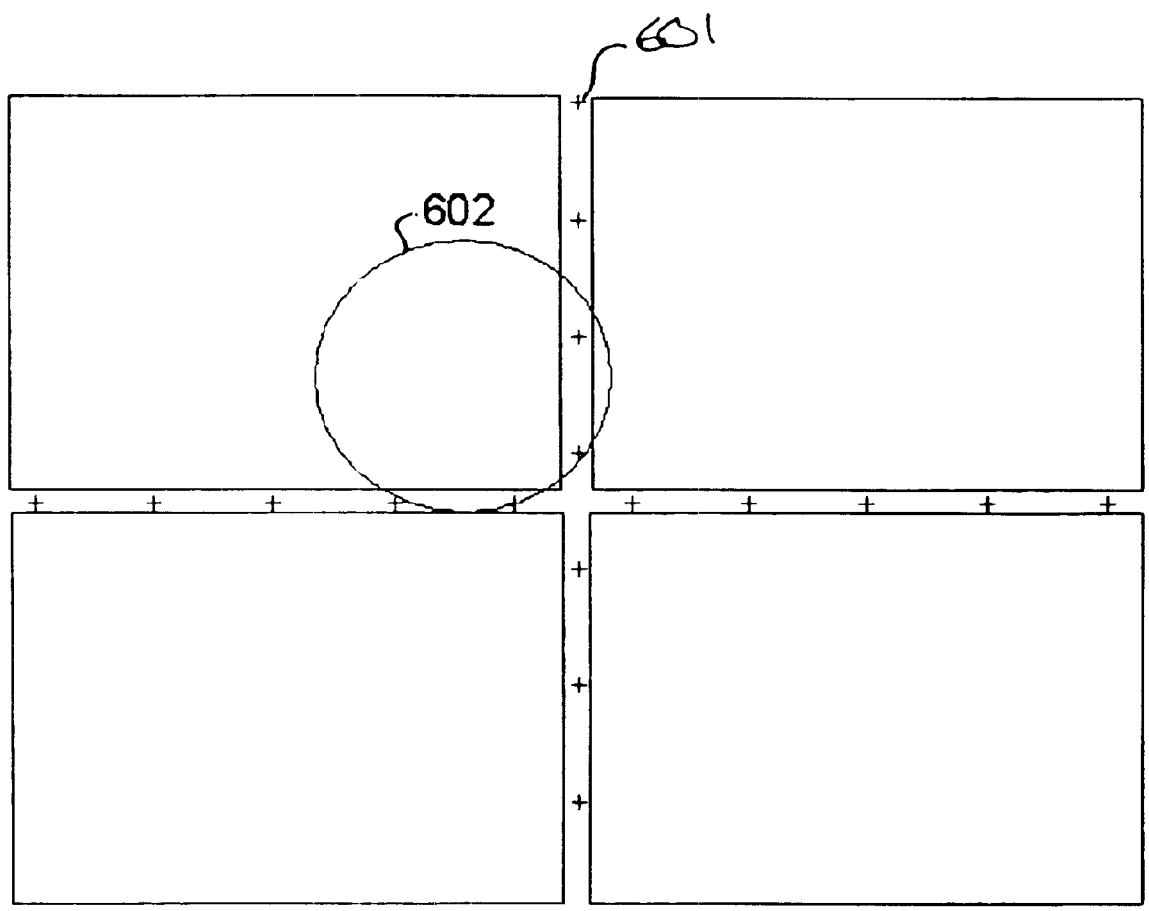
FIGS. 6a and 6b are diagrams of a wafer according to an embodiment of the present invention.
Figure 6B:
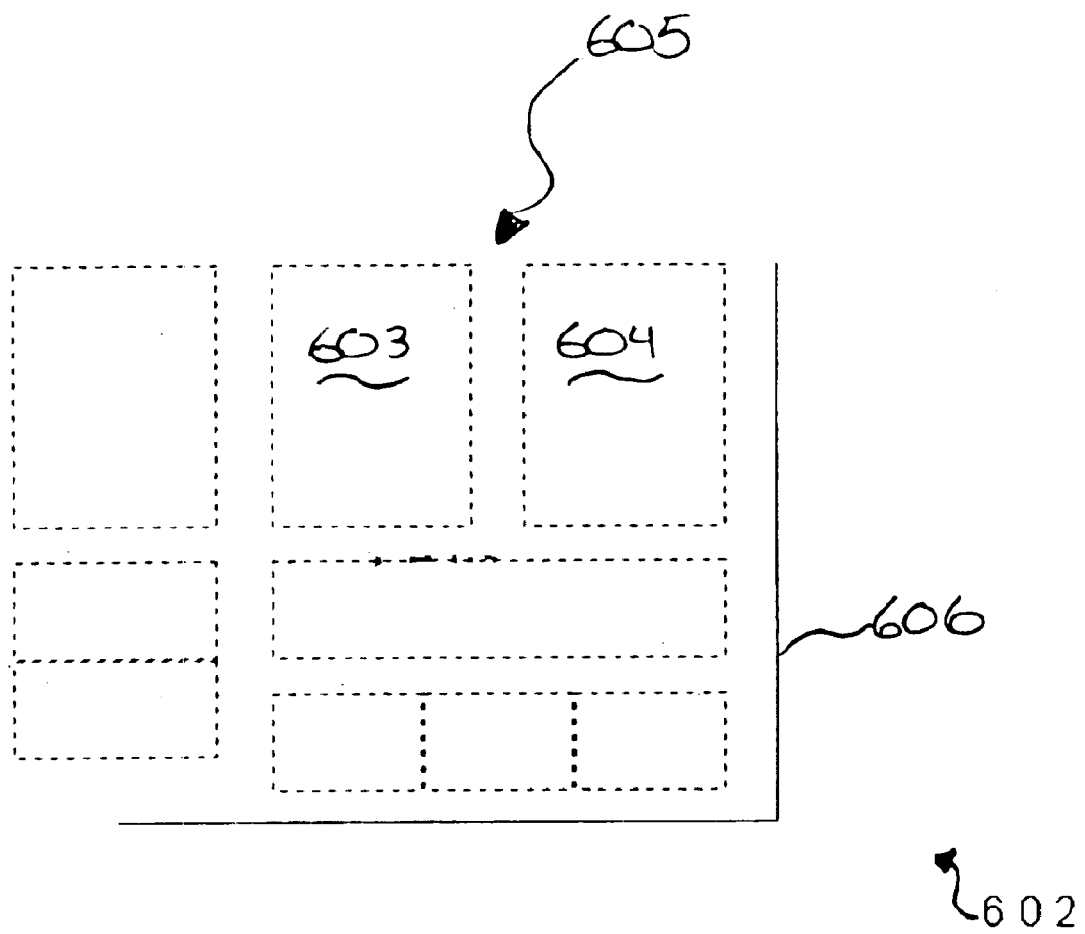

A substrate or wafer comprising an exposed photosensitive material can be provided. The substrate can be, for example, a Silicon oxide. According to an embodiment of the present invention, a mask can be pre-aligned to the wafer 501, as shown in FIG. 5. Referring to FIG. 6a, the pre-alignment can be a course alignment to traditional alignment marks 601 at the edge of the chips on the wafer. That is, the pre-alignment can be done by comparing coordinates of wafer and mask stages. At the level of the mask, the phase conflict regions can be determined 502. The phase conflict regions can be determined in a visible mode. At the level of the wafer, in a transmission mode, the target pattern on the wafer can be determined 503, for example, a dummy structure outside of the array of functional cells. Referring to FIGS. 6a and 6b, dummy structure (603, 604) can be formed in a portion of the array of cells 602. The dummy structures (603, 604) can be, for example, a dummy line or a structure such as a rectangle or a square patterned into a chip of the wafer. The method of detecting the phase conflict regions and the target pattern can use the same lense and stepper. The phase conflict regions can be aligned to the target pattern 504, that is, superimposed over a previous level. Upon the alignment of the conflict regions to the target pattern, the field or fields can be exposed 505 to pattern a resist. The process can be repeated 506 for different portions of the wafer or for different levels of a device being manufactured.

As shown in FIG. 6b, the alignment structure can be provided between or within the cells 605 of a chip 606. Intra-cell alignment structures can be more precise than traditional alignment structures on the periphery of the chip. For example, as the distance from the alignment structure increases, any misalignment is magnified. Thus, intra-cell alignment structures, which can be placed closer to the cells, can provide improved alignment.

Having described embodiments for a high-contract small alignment mark that can be implemented as means for an intra-cell alignment, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for intra-cell alignment of a substrate and a mask comprising the steps of:

providing the substrate comprising a photosensitive material and an alignment structure in an intra-cell region of the substrate;

providing a mask comprising a phase-shift region;

exposing the mask and the substrate to a light for determining an alignment;

determining a phase-conflict region by detecting a portion of the light reflected by the mask; and aligning the phase-shift region to the alignment structure of the substrate according to the phase-conflict region.

2. The method of claim 1, further comprising the steps of:

determining the alignment structure of the substrate.

3. The method of claim 1, further comprising the step of exposing a field of the substrate to actinic light to pattern the photosensitive material.

4. The method of claim 1, wherein the alignment structure comprises a dot.

5. The method of claim 1, wherein the alignment structure comprises a line.

6. The method of claim 1, wherein the alignment structure comprises a rectangle.

7. A method for intra-cell alignment of a substrate and a mask comprising the steps of:

providing the substrate comprising a photosensitive material, a first alignment structure in a periphery region of the substrate and a second alignment structure in an intra-cell region of the substrate;

providing a mask comprising a phase-shift region;

pre-aligning the phase-shift region to the first alignment structure of the substrate;

exposing the mask and the substrate to a light of a reflected mode;

determining a phase-conflict region by detecting a portion of the light of the reflected mode reflected by the phase-shift region; and aligning the phase-shift region to the second alignment structure of the substrate according to the phase-conflict region.

8. The method of claim 7, wherein the step of pre-aligning comprises the steps of:

determining the first alignment structure of the substrate.

9. The method of claim 7, further comprising the step of exposing a field of the substrate to actinic light to pattern the photosensitive material.

10. The method of claim 8, wherein the alignment structure comprises a dot.

11. The method of claim 8, wherein the alignment structure comprises a line.

12. The method of claim 8, wherein the alignment structure comprises a rectangle.

13. The method of claim 1, further comprising capturing an image of the phase-conflict region in the light for determining the alignment.

14. The method of claim 2, wherein determining the alignment structure uses a lens and a stepper used in determining the phase-conflict region.

15. The method of claim 3, wherein aligning the phase-shift region to the alignment structure of the substrate is performed prior to exposing the field of the substrate to actinic light.

16. The method of claim 7, further comprising capturing an image of the phase-conflict region in the reflected mode.

17. The method of claim 7, further comprising determining the second alignment structure using a lens and a stepper used in determining the phase-conflict region.

* * * * *